(12) United States Patent
Kushida

(10) Patent No.: US 8,310,898 B2
(45) Date of Patent: Nov. 13, 2012

(54) SEMICONDUCTOR STORAGE DEVICE

(75) Inventor: Keiichi Kushida, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 119 days.

(21) Appl. No.: 12/885,253

(22) Filed: Sep. 17, 2010

(65) Prior Publication Data

US 2012/0002490 A1     Jan. 5, 2012

(30) Foreign Application Priority Data

Jul. 1, 2010  (JP) .................................. 2010-151264

(51) Int. Cl.
  *G11C 8/00*  (2006.01)
(52) U.S. Cl. ............ 365/230.06; 365/189.011; 365/202; 365/203; 365/210.12
(58) Field of Classification Search ........... 365/189.011, 365/202, 203, 210.12, 230.06
See application file for complete search history.

(56) References Cited

U.S. PATENT DOCUMENTS

| 7,532,539 | B2 * | 5/2009 | Hirabayashi | ............. | 365/230.06 |
| 2008/0019194 | A1 * | 1/2008 | Katayama et al. | ....... | 365/189.15 |

FOREIGN PATENT DOCUMENTS

| JP | 07-211098 | 8/1995 |
| JP | 2000-049309 | 2/2000 |
| JP | 2008-047190 | 2/2008 |

OTHER PUBLICATIONS

Background Art Information, Dec. 2009.

* cited by examiner

*Primary Examiner* — Toan Le
(74) *Attorney, Agent, or Firm* — Knobbe, Martens, Olson & Bear LLP

(57) ABSTRACT

According to the embodiments, a semiconductor storage device includes a memory cell array, a plurality of word lines, a plurality of bit lines, and a row selector that multiply-selects the word lines, wherein the semiconductor storage device satisfies $N_{cell}/N_{WL} \leq (4 \times C_{bl} \times V_{DD})/(I_{cell} \times T_{cyc})$, where $N_{cell}$ is number of memory cells connected to each of the bit lines, $N_{WL}$ is a unit of number of word lines multiply-selected by the row selector, $C_{bl}$ is a value obtained by dividing a capacitance of the bit line by $N_{cell}$, $V_{DD}$ is a power supply voltage, $T_{cyc}$ is an operating frequency of each of the memory cells, and $I_{cell}$ is a target value of current read out via each of the bit lines.

4 Claims, 12 Drawing Sheets

| Mode | f | $V_{DD}$ | Cap. | VWL |
|---|---|---|---|---|
| 1 | HIGH SPEED | HIGH VOLTAGE | LARGE CAPACITY (1 cell/bit) | $V_{DD}$ |
| 2 | LOW SPEED | LOW VOLTAGE | SMALL CAPACITY ($N_{WL}$ cells/bit) | $V_{DD} - \Delta V$ |

| Mode | f | $V_{DD}$ | Cap. | VWL |
|---|---|---|---|---|
| 1 | HIGH SPEED | HIGH VOLTAGE | LARGE CAPACITY (1 cell/bit) | $V_{DD}$ |
| 2 | LOW SPEED | LOW VOLTAGE | SMALL CAPACITY ($N_{WL}$ cells/bit) | $V_{DD} + \Delta V$ |

VCS>VWL>V_DD

SEMICONDUCTOR STORAGE DEVICE

CROSS-REFERENCE TO RELATED APPLICATIONS

This application is based upon and claims the benefit of priority from the prior Japanese Patent Application No. 2010-151264, filed on Jul. 1, 2010; the entire contents of all of which are incorporated herein by reference.

FIELD

Embodiments generally relate to a semiconductor storage device.

BACKGROUND

In a recent semiconductor, a low power consumption by a low voltage operation has been progressed. In a semiconductor storage device such as an SRAM, a current level read out from a memory cell tends to degrade significantly by this low power consumption.

DETAILED DESCRIPTION

According to one embodiment, there is provided a semiconductor storage device comprising: a memory cell array in which a plurality of memory cells is arranged in a matrix; a plurality of word lines which extend in a row direction of the matrix and which are connected to the plurality of memory cells; a plurality of bit lines which extend in a column direction of the matrix and which are connected to the plurality of memory cells; and a row selector that multiply-selects the word lines, wherein the semiconductor storage device satisfies $N_{cell}/N_{WL} \leq (4 \times C_{bl} \times V_{DD})/(I_{cell} \times T_{cyc})$ where $N_{cell}$ is number of memory cells connected to each of the bit lines, $N_{WL}$ is a unit of number of word lines multiply-selected by the row selector, $C_{bl}$ is a value obtained by dividing a capacitance of the bit line by $N_{cell}$, $V_{DD}$ is a power supply voltage, $T_{cyc}$ is an operating frequency of each of the memory cells, and $I_{cell}$ is a target value of current read out via each of the bit lines.

A semiconductor storage device according to embodiments will be explained below in detail with reference to attached drawings. The scope of the present invention is not limited to these embodiments.

(First Embodiment)

Figures 1A, 1B:
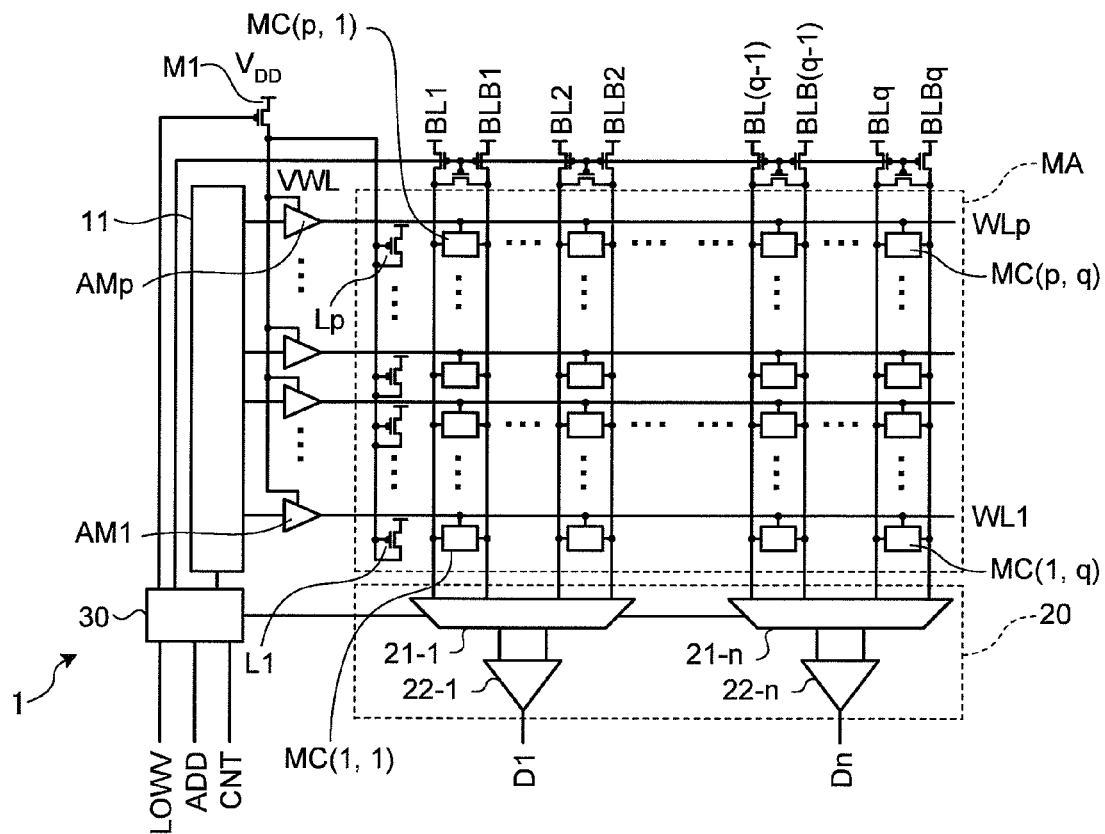
FIGS. 1A and 1B are diagrams illustrating a configuration and operation modes of a semiconductor storage device according to a first embodiment.

A semiconductor storage device 1 according to the first embodiment is explained with reference to FIGS. 1A and 1B.

The semiconductor storage device 1, for example, is an SRAM. The semiconductor storage device 1 in FIG. 1A includes a memory cell array MA, a plurality of word lines WL1 to WLp, a plurality of bit lines BL1 to BLq, a plurality of inverted bit lines BLB1 to BLBq, a controller (control unit) 30, a row decoder (row selector) 11, a transistor M1, a plurality of drive amplifiers AM1 to AMp, and a column selection block (column selector) 20.

In the memory cell array MA, a plurality of memory cells MC (MC(1,1) to MC(p,q)) is arranged in a p×q matrix, where p and q are a positive integer larger than 1, respectively.

The word lines WL are connected to the memory cells MC in units of row. That is, each word line WL extends in a row direction of the matrix, and is connected to the memory cells which are arranged in a row in the memory cell array MA.

The bit lines BL are connected to the memory cells MC in units of column. The inverted bit lines BLB are connected to the memory cells MC in units of column. To each inverted bit line BLB, a signal that is logically inverted with respect to the corresponding bit line BL is transmitted. In other words, a plurality of bit line pairs (BL1, BLB1) to (BLq, BLBq) is connected to a plurality of the memory cells MC in units of column. That is, each pair (BL, BLB) extends in a column direction of the matrix, and is connected to the memory cells which are arranged in a column in the memory cell array MA. In the followings, the inverted bit lines BLB are similar to the bit lines BL, so that explanation thereof is omitted.

A signal LOWV instructing a low voltage operation, an address signal ADD, and a control signal CNT are supplied to the controller 30 from an outside (e.g. an external control circuit). The controller 30 switches between a first mode and a second mode in accordance with these signals and operates the row decoder 11, column decoders 21, and the transistor M1 in accordance with the switched mode. The first mode is, for example, a high-speed operation mode for operating the memory cells MC at high speed, and the second mode is, for example, a low-voltage operation mode for operating the memory cells MC at a low voltage.

For example, when the signal LOWV is at a nonactive level, the controller 30 generates a control signal MODE indicating the first mode (Mode "1" shown in FIG. 1B) and outputs it, and when the signal LOWV is at an active level, the controller 30 generates the control signal MODE indicating the second mode (Mode "2") and outputs it. Moreover, the controller 30 controls a level of a power supply voltage $V_{DD}$ so that the power supply voltage $V_{DD}$ in the second mode becomes lower than the power supply voltage $V_{DD}$ in the first mode. Furthermore, the controller 30 controls a frequency of a control signal supplied to the row decoder 11, the column decoders 21, the transistor M1, and the like so that an operating frequency f of the memory cell in the second mode becomes lower than the operating frequency f of the memory cell in the first mode. The control of the level of the power supply voltage $V_{DD}$ and the control of the frequency of the control signal can be performed from the external control circuit.

The row decoder 11 receives the control signal MODE output from the controller 30 and a predetermined control signal. The row decoder 11 selects a word line in units of one line from among the word lines WL in the first mode and multiply-selects the word lines in units of $N_{WL}$ lines from among the word lines WL in the second mode.

When the control signal MODE indicates the first mode, the transistor M1 becomes an on state, and when the control signal MODE indicates the second mode, the transistor M1 becomes an off state. The transistor M1 is, for example, a PMOS transistor, which is turned on in the first mode and outputs the power supply voltage $V_{DD}$ to the drive amplifiers AM as a drive voltage VWL. The transistor M1 is turned off in the second mode and outputs a voltage $V_{DD}-\Delta V$ lower than the power supply voltage $V_{DD}$, as the drive voltage VWL, to the drive amplifiers AM by employing load elements L1 to Lp. Each of the load elements L1 to Lp is, for example, a PMOS transistor that is diode-connected.

The drive amplifiers AM supply, in the first mode, a voltage approximately equal to the power supply voltage $V_{DD}$ to the word line of the selected row (one line) as the drive voltage VWL (i.e., as the control signal at the active level). The drive amplifiers AM supply, in the second mode, the voltage ($V_{DD}-\Delta V$) lower than the power supply voltage $V_{DD}$ to the selected $N_{WL}$ word lines as the drive voltage VWL.

The column selection block 20 selects bit lines to be accessed from among a plurality of columns of the bit lines BL. The column selection block 20, for example, includes n column decoders 21 (21-1 to 21-n) and n sense amplifiers 22 (22-1 to 22-n). The n column decoders 21 select n bit lines in parallel from among the bit lines BL and read out n pieces of data in parallel from the memory cells selected by the row decoder 11 to the n sense amplifiers 22. In other words, the memory cells selected by the row decoder 11 output data having read out from memory cells via the n column decoders 21 to the n sense amplifiers 22. The n sense amplifiers 22 amplify the data and output it as read data D1 to Dn.

Moreover, the n column decoders 21 receive data to be written in units of n bits, select n bit lines in parallel, and write the data in the memory cells selected by the row decoder 11. In other words, the memory cells selected by the row decoder 11 receive data to be written in the memory cells from the n column decoders 21. "n" is a number that is larger than 1 and is a divisor of q.

Figure 2:
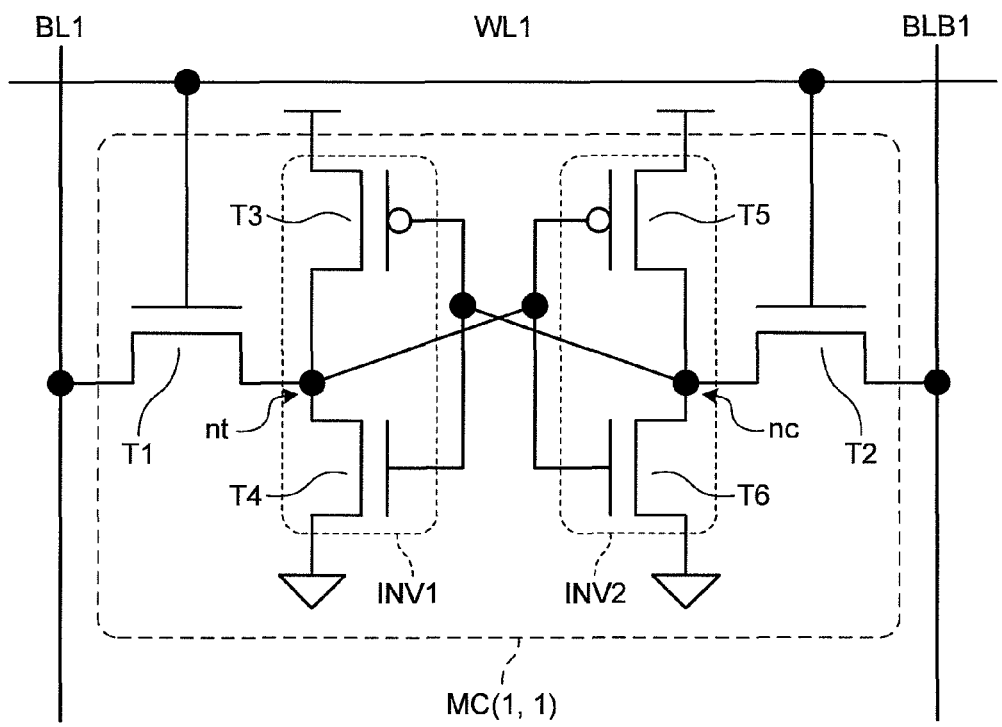
FIG. 2 is a diagram illustrating a configuration of a memory cell in the first embodiment.

The configuration of the memory cell is explained with reference to FIG. 2. The memory cell MC is, for example, a six-transistor SRAM cell that includes load transistors T3 and T5, drive transistors T4 and T6, and transfer transistors T1 and T2. The load transistor T3 and the drive transistor T4 constitutes an inverter INV1, and the load transistor T5 and the drive transistor T6 constitutes an inverter INV2. The output terminal of the inverter INV1 is connected to the input terminal of the inverter INV2, and the output terminal of the inverter INV2 is connected to the input terminal of the inverter INV1. The inverter INV1 and the inverter INV2 constitutes a flipflop.

The transfer transistor T1 is connected between a storage node nt of the flipflop and the bit line BL. The transfer transistor T2 is connected between an inverted storage node nc of the flipflop and the inverted bit line BLB. Each of the transfer transistors T1 and T2 is turned on when the control signal at the active level is supplied to the word line WL to transfer data stored in the storage nodes nt and nc to the bit line BL and the inverted bit line BLB, respectively. Whereby, the data stored in the memory cell MC is read out to the column decoder 21 via the bit line BL and the inverted bit line BLB.

The operation of the row decoder 11 in the second mode is explained.

The row decoder 11 multiply-selects the word lines in units of $N_{WL}$ lines from among the word lines WL in the second mode. At this time, the row decoder 11 determines $N_{WL}$ so that the following mathematical formula (1) is satisfied.

$$N_{cell}/N_{WL} \leq (4 \times C_{bl} \times V_{DD})/(I_{cell} \times T_{cyc}) \quad (1)$$

In the mathematical formula (1), $N_{cell}$ represents the number of the memory cells connected to each bit line BL, and in the case of the configuration of FIG. 1, $N_{cell}$=p. $C_{bl}$ represents a value obtained by dividing the capacitance of the bit line BL (for example, value obtained by averaging the capacitance of the bit line BL among the bit lines BL) by $N_{cell}$. $V_{DD}$ represents the power supply voltage. $T_{cyc}$ represents the operating frequency of each memory cell MC. $I_{cell}$ represents a target value of current read out via each bit line BL. It should be noted that, the number of the word lines $N_{WL}$ to be multiply-selected becomes smaller than the number of the memory cells connected to each bit line BL, so that it is apparent that the following mathematical formula (2) is satisfied.

$$N_{cell}/N_{WL} \geq 1 \quad (2)$$

In the above mathematical formula (1), if a predetermined value used in an actual circuit design is assigned, for example, the following mathematical formula (3) is obtained.

$$N_{cell}/N_{WL} \leq 64 \quad (3)$$

Figure 3:
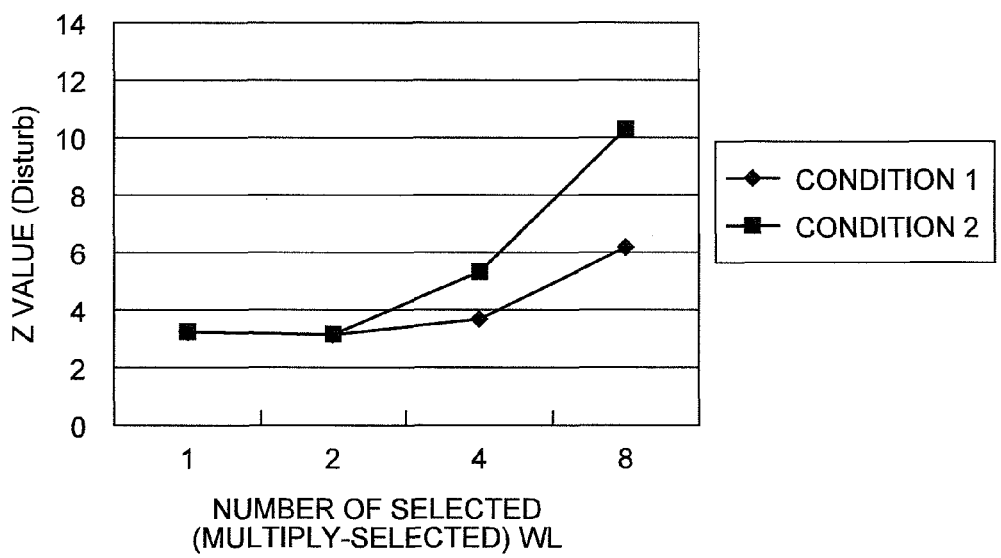
FIG. 3 is a diagram illustrating an effect by the first embodiment.

Explanation is given for how the destruction property of data stored in the memory cell when reading out the data from the memory cell is improved by configuring to satisfy the mathematical formula (1) with reference to FIG. 3.

FIG. 3 illustrates an evaluation result (Z value (Disturb)) for a condition 1 and a condition 2 when $N_{WL}$ is changed to 1, 2, 4, and 8, in which $N_{cell}$=128 and $V_{DD}$=0.5 (V). In FIG. 3, a vertical axis indicates the value of the Z value (Disturb) and a horizontal axis indicates $N_{WL}$.

"Disturb" means a destruction of the data stored in the memory cell when reading out the data, and means, for example, in the case where the memory cell is an SRAM cell, logical inversion of the data stored in the memory cell when reading out the data from the memory cell.

The Z value is an index indicating a probability of occurrence (fraction defective) of an evaluation target in statistics. As the probability of occurrence of Disturb becomes high (low), the value of the Z value (Disturb) becomes small (large).

In the condition 1, read data of $N_{WL}$ memory cells is treated as appropriate data in which Disturb does not occur when the level of all of data satisfies a reference level, or is treated as bad data in which Disturb occurs when data that does not satisfy the reference level is included in the data of $N_{WL}$ memory cells.

The reference level indicates a voltage level to be a reference when determining the H level or the L level.

For example, when the power supply voltage $V_{DD}$ is 0.5 V and all of data need to be at the H level, if the reference level is set to 0.35 V, data equal to or more than 0.35 V becomes data satisfying the reference level, and data less than 0.35 V becomes data that does not satisfy the reference level. For example, data of 0.4 V becomes data satisfying the reference level and data of 0.3 V becomes data that does not satisfy the reference level.

Alternatively, for example, when the power supply voltage $V_{DD}$ is 0.5 V and all of data need to be at the L level, if the reference level is set to 0.25 V, data equal to or less than 0.25 V becomes data satisfying the reference level, and data exceeding 0.25 V becomes data that does not satisfy the reference level. For example, data of 0.2 V becomes data satisfying the reference level and data of 0.3 V becomes data that does not satisfy the reference level.

In other words, when the level of data of at least one memory cell does not satisfy the reference level, data of $N_{WL}$ memory cells is treated as bad data.

In the condition 2, the read data of $N_{WL}$ memory cells is treated as appropriate data when $(N_{WL}/2)-1$ or less pieces of data that does not satisfy the reference data is included in the data of $N_{WL}$ memory cells, or is treated as bad data when more than $(N_{WL}/2)-1$ pieces of data that does not satisfy the reference data is included in the data of $N_{WL}$ memory cells. In other words, the condition 2 saves the $(N_{WL}/2)-1$ or less pieces of data that does not satisfy the reference level.

For example, in the case of multiply-selecting four word lines, if it is determined that data that does not satisfy the reference level is included in more than one (two or more) memory cells, four pieces of data is treated as bad data.

As shown in FIG. 3, when $N_{WL}$ is increased from 1 to 2, it is found that the value of the Z value (Disturb) is slightly lowered and the probability of occurrence of Disturb becomes high in any of the condition 1 and the condition 2. In other words, any of $N_{WL}=1$ and 2 do not satisfy the mathematical formula (1).

On the other hand, when $N_{WL}$ is 4 or 8, it is found that the value of the Z value (Disturb) is improved and the probability of occurrence of Disturb decreases in any of the condition 1 and the condition 2. The mathematical formula (1) is satisfied in both of $N_{WL}=4$ and 8. In other words, it is confirmed that Disturb property are improved by configuring to satisfy the mathematical formula (1).

With the configuration satisfying the mathematical formula (1), it is found that a value of a Z value (Disturb) is increased remarkably by saving $(N_{WL}/2)-1$ or less pieces of data (fail bit) that does not satisfy the reference level. When the mathematical formula (1) is not satisfied, it is confirmed that such a remarkable effect cannot be obtained. In other words, it is confirmed that the Z value of Disturb is improved remarkably by configuring to satisfy the mathematical formula (1) and saving data (fail bit) that does not satisfy the reference level.

Figure 4:
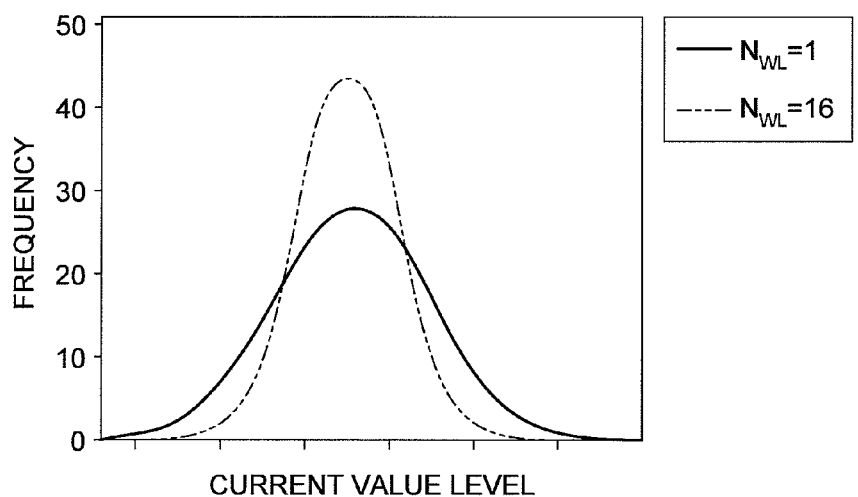
FIG. 4 is a diagram illustrating an effect by the first embodiment.

Explanation is given for how variation of a read current from the memory cells is improved by configuring to satisfy the mathematical formula (1) with reference to FIG. 4.

FIG. 4 illustrates a distribution of the read current value from each memory cell when $N_{WL}$ is 1 and 16, in which $N_{cell}=128$ and $V_{DD}=0.5$ (V). In FIG. 4, a vertical axis indicates a frequency and a horizontal axis indicates the level of the read current value.

As shown in FIG. 4, when $N_{WL}$ is 16, it is found that the distribution of the read current value becomes sharp.

Although $N_{WL}=1$ does not satisfy the mathematical formula (1), $N_{WL}=16$ satisfies the mathematical formula (1). In other words, it is confirmed that variation of the read current value is improved by configuring to satisfy the mathematical formula (1).

Figure 5:
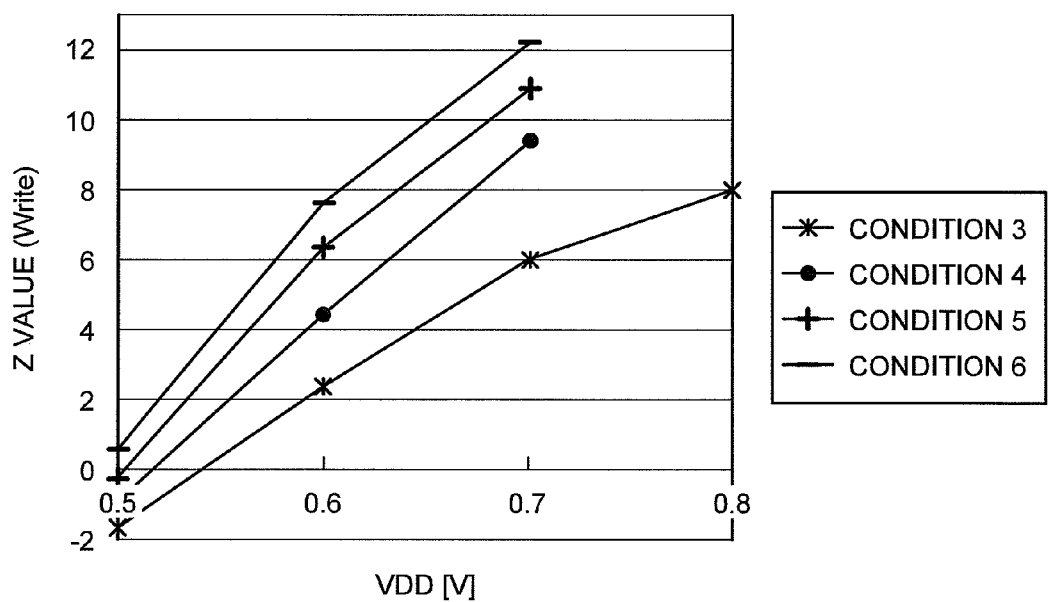
FIG. 5 is a diagram illustrating an effect by the first embodiment.

Explanation is given for how the Z value of writing in the memory cell is improved by configuring to satisfy the mathematical formula (1) with reference to FIG. 5.

FIG. 5 illustrates an evaluation result (Z value (Write)) for conditions 3 to 6 when the value of the power supply voltage $V_{DD}$ is changed between 0.5 and 0.8 (V), in which $N_{cell}=128$ and $N_{WL}=8$. In FIG. 5, a vertical axis indicates the value of the Z value (Write) and a horizontal axis indicates the value of the power supply voltage $V_{DD}$. When $N_{cell}=128$ and $N_{WL}=8$, any power supply voltage $V_{DD}$ between 0.5 and 0.8 (V) satisfies the mathematical formula (1).

In the condition 3, read data of $N_{WL}$ memory cells is treated as appropriate data in which Disturb does not occur when the level of all of data satisfies the reference level, or is treated as bad data in which Disturb occurs when data that does not satisfy the reference level is included in the data of $N_{WL}$ memory cells.

In the condition 4, the read data of $N_{WL}$ memory cells is treated as appropriate data when no more than one data that does not satisfy the reference data is included in the data of $N_{WL}$ memory cells, or is treated as bad data when two or more pieces of data that does not satisfy the reference data is included in the data of $N_{WL}$ memory cells. In other words, the condition 4 saves the no more than one data that does not satisfy the reference level.

In the condition 5, the read data of $N_{WL}$ memory cells is treated as appropriate data when two or less pieces of data that does not satisfy the reference data is included in the data of $N_{WL}$ memory cells, or is treated as bad data when three or more pieces of data that does not satisfy the reference data is included in the data of $N_{WL}$ memory cells. In other words, the condition 5 saves the two or less pieces of data that does not satisfy the reference level.

In the condition 6, the read data of $N_{WL}$ memory cells is treated as appropriate data when three or less pieces of data that does not satisfy the reference data is included in the data of $N_{WL}$ memory cells, or is treated as bad data when four or more pieces of data that does not satisfy the reference data is included in the data of $N_{WL}$ memory cells. In other words, the condition 6 saves the three or less pieces of data that does not satisfy the reference level.

With the configuration satisfying the mathematical formula (1), as shown in FIG. 5, it is found that the value of the Z value (Write) is increased remarkably as the number of pieces of saved data that does not satisfy the reference level increases. When the mathematical formula (1) is not satisfied, it is confirmed that such a remarkable effect cannot be obtained (although not shown in FIG. 5). In other words, it is confirmed that the Z value of writing in the memory cell is improved remarkably by configuring to satisfy the mathematical formula (1) and saving data (fail bit) that does not satisfy the reference level.

Figure 6A:
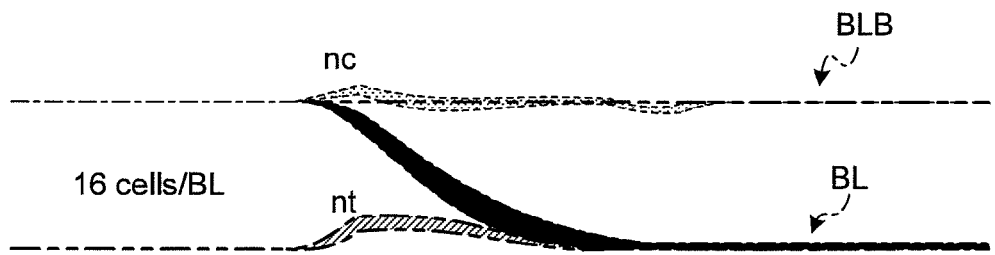
FIGS. 6A to 6C are diagrams illustrating simulation results.
Figure 6B:
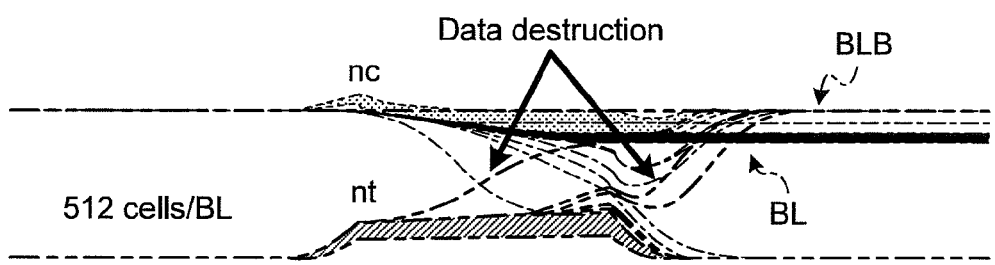
Figure 6C:

A case is assumed where, in the second mode, the row decoder 11 multiply-selects the word lines such that the mathematical formula (1) is not satisfied, for example, in units of two lines from among the word lines WL. In this case, two transistors in two memory cells operate at a low voltage and charge/discharge the bit line, so that the time for the charging tends to be long (see FIG. 3). Therefore, for example, a voltage level of read data from the memory cell is considered to change as shown in FIG. 6B. FIG. 6B illustrates a result when performing a simulation of the voltage level of the read data from the memory cell in a read period of the data (period in which the word line WL is at the H level as shown FIG. 6C), in which $N_{cell}=512$ and $N_{WL}=2$ that do not satisfy the mathematical formula (1). As shown in FIG. 6B, the data stored in the memory cell may be destructed in the read period of the data from the memory cell.

On the other hand, in the first embodiment, in the second mode, the row decoder 11 multiply-selects the word lines such that the mathematical formula (1) is satisfied, for example, in units of eight lines from among the word lines WL. In this case, eight transistors in eight memory cells operate and charge/discharge the bit line, so that even if operating at a low voltage, the bit lines can be charged/ discharged at high speed. Whereby, for example, the voltage level of the read data from the memory cell is considered to change as shown in FIG. 6A. FIG. 6A illustrates a result when performing a simulation of the voltage level of the read data from the memory cell in the read period of the data (period in which the word line WL is in the H level as shown FIG. 6C), in which $N_{cell=}16$ and $N_{WL=}2$ that satisfy the mathematical formula (1). It is considered that the similar simulation result is obtained also in the case of $N_{cell=}512$ and $N_{WL=}8$ that satisfy the mathematical formula (1). In other words, in the read period of the data from the memory cell, the level of the bit line can be settled before destruction of the data stored in the memory cell occurs (i.e. the semiconductor storage device 1 can be operated with the operation waveform similar to that of FIG. 6A). Consequently, it is possible to suppress destruction of the data stored in the memory cell when reading out the data from the memory cell.

Nr is a positive integer smaller than $N_{WL}/2$. At this time, when data that does not satisfy the reference level is included in Nr or less memory cells, read data of $N_{WL}$ memory cells is treated as appropriate data. When data that does not satisfy the reference level is included in more than Nr memory cells, the read data of $N_{WL}$ memory cells is treated as bad data. Whereby, the Z value (Disturb) and the Z value (Write) are improved remarkably.

Moreover, in the second mode, when data is read out from $N_{WL}$ memory cells, the read current of the memory cells transmitted via each bit line can be increased by $N_{WL}$ times, so that sufficient read current can be obtained even if the memory cells are operated at a low voltage. It should be noted that, although the $N_{WL}$ memory cells are used for storage of one bit and thereby a storage capacity becomes $1/N_{WL}$, the storage capacity that is needed in the second mode is not as large as the storage capacity that is needed in the first mode, so that even if the storage capacity is reduced, a major problem does not occur.

It should be also noted that the semiconductor storage device 1 can be a DRAM or an FeRAM. In these cases, the semiconductor storage device 1 can be configured such that a plurality of the inverted bit lines BLB is omitted.

(Second Embodiment)

Figure 7:
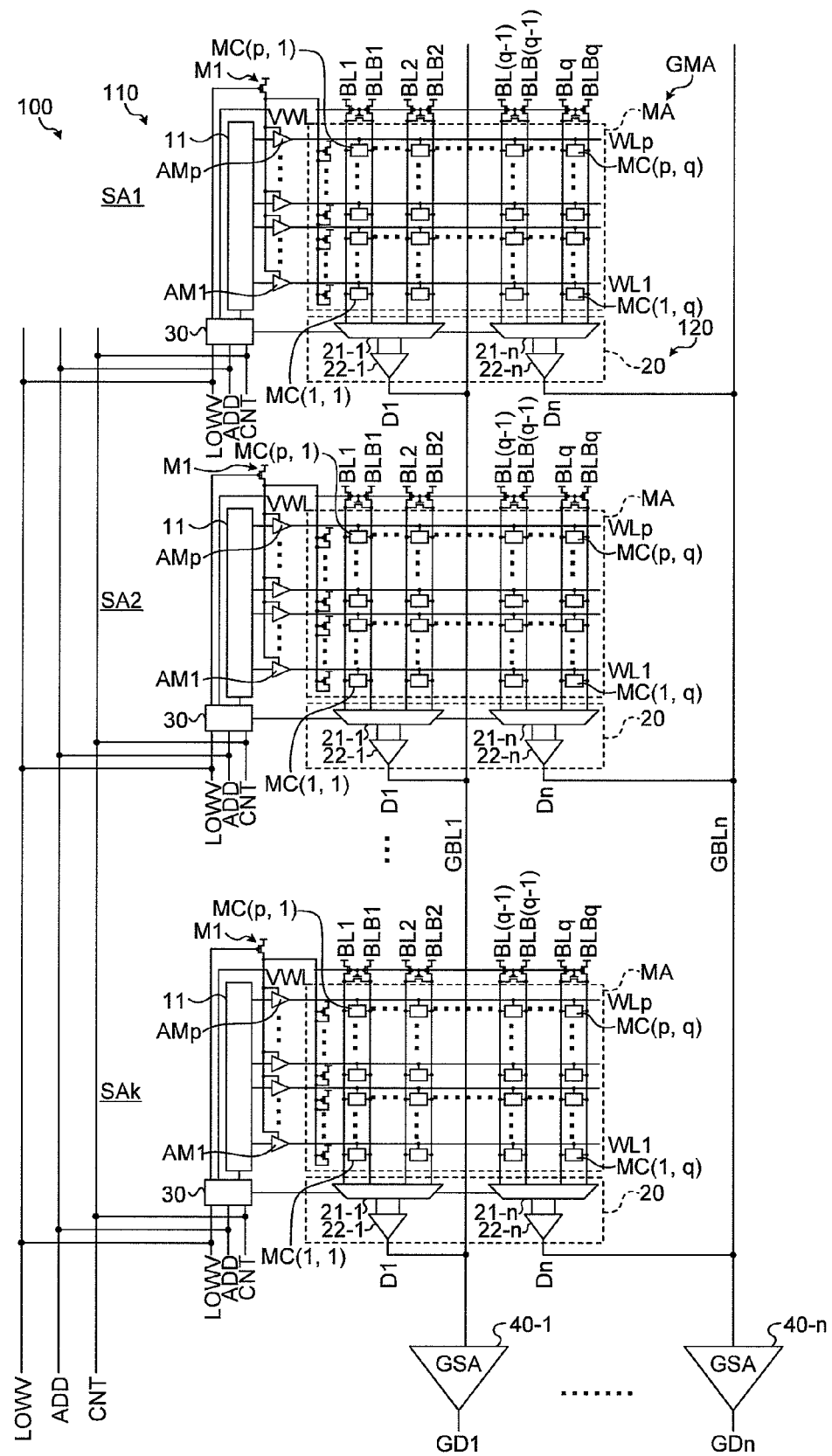
FIG. 7 is a diagram illustrating a configuration of a semiconductor storage device according to a second embodiment.

A semiconductor storage device 100 according to the second embodiment is explained with reference to FIG. 7. The semiconductor storage device 100, for example, includes a plural stages (k stages in FIG. 7) of sub-arrays SA, each sub-array SA having a configuration similar to the semiconductor storage device 1 in the first embodiment. In the followings, points different from the first embodiment are mainly explained. "k" is a positive integer larger than 1.

The semiconductor storage device 100 includes a plurality (plural stages) of sub-arrays SA1 to SAk, a plurality of global bit lines GBL1 to GLBn, and global sense amplifiers (GSA) 40-1 to 40-n. A global memory cell array GMA is formed by collecting the memory cell arrays MA for the sub-arrays SA1 to SAk, a row selector 110 is formed by collecting the row decoders 11 for the sub-arrays SA1 to SAk, and a column selector 120 is formed by collecting the column selection blocks 20 for the sub-arrays SA1 to SAk.

Each row decoder 11 in the row selector 110 is similar to the row decoder 11 in the first embodiment. In other words, the operation of selecting the word line in units of one line from among the word lines WL1 to WLp in the first mode and multiply-selecting the word lines in units of $N_{WL}$ lines from among the word lines WL1 to WLp in the second mode is performed for each sub-array SA. For example, in the second mode, the row decoder 11 multiply-selects the word lines in units of $N_{WL}$ lines from among the word lines (first word lines) WL1 to WLp. In other words, switching between the first mode and the second mode is performed for each sub-array SA.

Each column selection block 20 in the column selector 120 is similar to the column selection block 20 in the first embodiment. In other words, the operation of selecting the bit line to be accessed (readout or writing) from among the bit lines of a plurality of columns is performed for each sub-array SA. For example, for the memory cells that are multiply-selected by the row decoder 11, data is read out or written via the bit lines BL1 to BLq for each sub-array SA.

The data read out for each sub-array SA is amplified in the corresponding global sense amplifiers 40 via the corresponding global bit lines GBL to be output as output data GD1 to GDn.

Explanation is given for the configuration relevant to the sub-array and the operation of the row decoder in the second mode. The global memory cell array GMA is divided into k sub-arrays SA in a column direction. For example, when the number of the memory cells of each column of the global memory cell array GMA is 512 and k=32, the number of the memory cells of each column of one sub-array SA is 16. In this case, the number of the memory cells connected to the bit line is 16 ($N_{cell=}16$), so that the row decoder 11 can perform operations to satisfy the mathematical formula (1) even if the number of the word lines to be multiply-selected is set to, for example, $N_{WL=}2$. In other words, in the second embodiment, the inside of the global memory cell array GMA is divided for a plurality of the sub-arrays SA (i.e., divided into a plurality of the memory cell arrays MA), so that the number of the memory cells to be connected to one bit line is limited.

A case is assumed where the inside of the global memory cell array GMA is not divided for a plurality of the sub-arrays SA. Moreover, it is assumed that, in the second mode, the row decoder 11 multiply-selects the word lines in units of two lines such that the mathematical formula (1) is not satisfied. In this case, two transistors in two memory cells operate at a low voltage to charge/discharge the bit line, so that the time for the charging tends to be long (as in the case where the multiple selection is not performed). Therefore, the voltage level of the read data from the memory cell is considered to change as shown in FIG. 6B, so that the data stored in the memory cell may be destructed in the read period of the data from the memory cell.

On the other hand, in the second embodiment, the inside of the global memory cell array GMA is divided for a plurality (for example, k stages) of the sub-arrays SA (i.e., divided into a plurality of the memory cell arrays MA) in the column direction. In other words, the number of the memory cells connected to one bit line is limited to, for example, 1/k (for example, $N_{cell=}16$). Each row decoder can perform operations to satisfy the mathematical formula (1) even if the number of the word lines to be multiply-selected is determined to, for example, $N_{WL=}2$. Therefore, the capacitance value of each bit line can be reduced compared with the case where the global memory cell array GMA is not divided for the sub-arrays SA, so that even if the transistors of two memory cells operate at a low voltage, the bit line can be charged/discharged at high speed. Whereby, the voltage level of data read out from the memory cell is considered to change as shown in FIG. 6A. In other words, because capacitance value of the bit line is sufficiently small (lowered), the level of the bit line falls sharply from the H level to the L level, or the level of the bit line rises sharply from the L level to the H level. Whereby, in the read period of the data from the memory cell, the level of the bit line can be settled before destruction of the data stored in the memory cell occurs. Consequently, it is possible to suppress destruction of the data stored in the memory cell when reading out the data from the memory cell.

Moreover, the global memory cell array GMA is configured as a set of the memory cell arrays MA arranged in the column direction, so that the storage capacity of the global memory cell array GMA can be easily made large. It is possible to suppress destruction of data stored in the memory cell when reading out the data from the memory cell while making the storage capacity of the global memory cell array GMA large.

(Third Embodiment)

Figures 8A, 8B:
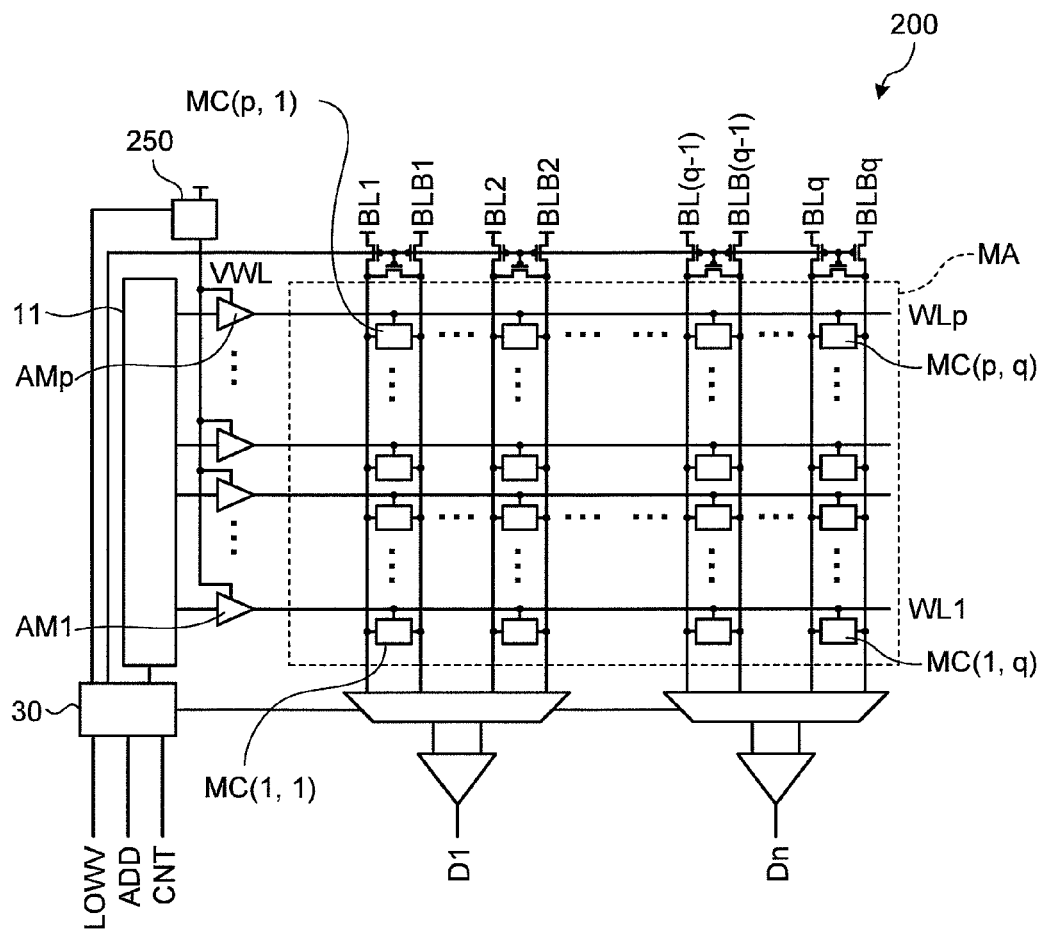
FIGS. 8A and 8B are diagrams illustrating part of a configuration and operation modes of a semiconductor storage device according to a third embodiment.

A semiconductor storage device 200 according to the third embodiment is explained with reference to FIGS. 8A and 8B. In the followings, points different from the second embodiment are mainly explained.

The semiconductor storage device 200 includes a generating circuit (supplier) 250 instead of the transistor M1. The generating circuit 250 switches the drive voltage VWL to be supplied to the word lines WL depending on the mode. In other words, the generating circuit 250 supplies the power supply voltage $V_{DD}$ to one word line selected in the first mode and supplies a voltage ($V_{DD}+\Delta V$) higher than the power supply voltage $V_{DD}$ to $N_{WL}$ word lines multiply-selected in the second mode (as shown in FIG. 8B).

Figure 9:
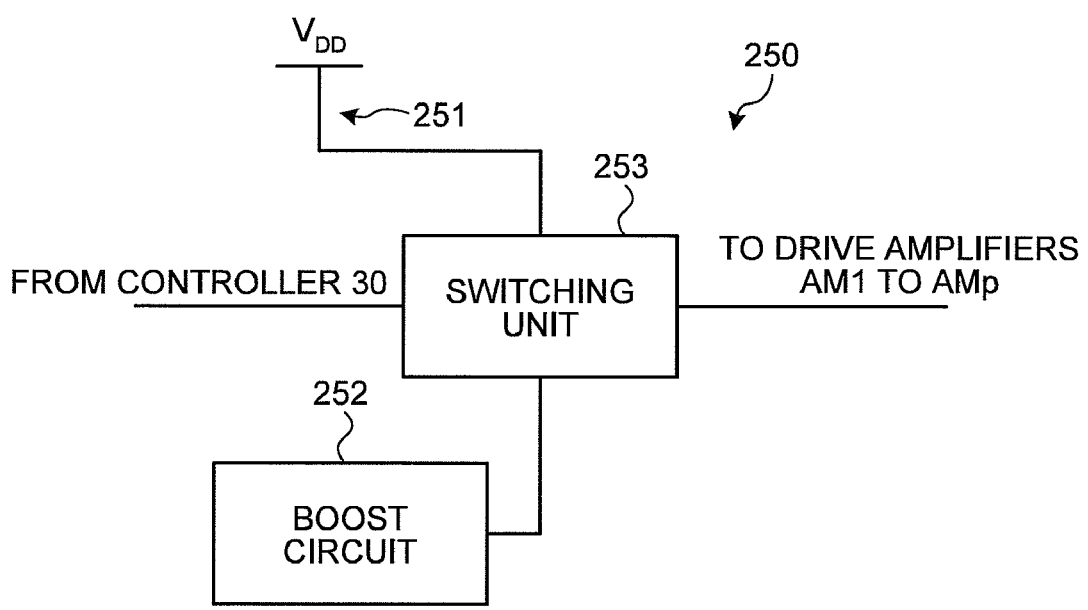
FIG. 9 is a diagram illustrating a configuration of a supplier in the third embodiment.

FIG. 9 is a configuration diagram of the generating circuit 250. The generating circuit 250 includes a power supply node 251, a boost circuit 252, and a switching unit 253. The power supply node 251 is connected to the power supply voltage $V_{DD}$. The boost circuit 252 generates a voltage higher than the power supply voltage $V_{DD}$.

A control signal is input to the switching unit 253 from the controller 30. The switching unit 253 switches such that when the control signal indicates the first mode, the switching unit 253 outputs the power supply voltage $V_{DD}$ from the power supply node 251, and when the control signal indicates the second mode, the switching unit 253 outputs a voltage (corresponding to $V_{DD}+\Delta V$) higher than the power supply voltage $V_{DD}$ received from the boost circuit 252.

Figure 10A:
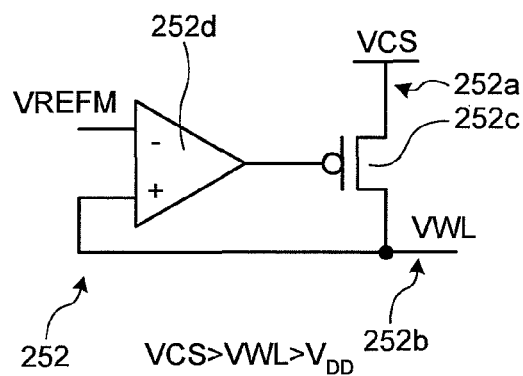
FIGS. 10A and 10B are diagrams, each illustrating a configuration of a boost circuit in the third embodiment.
Figure 10B:
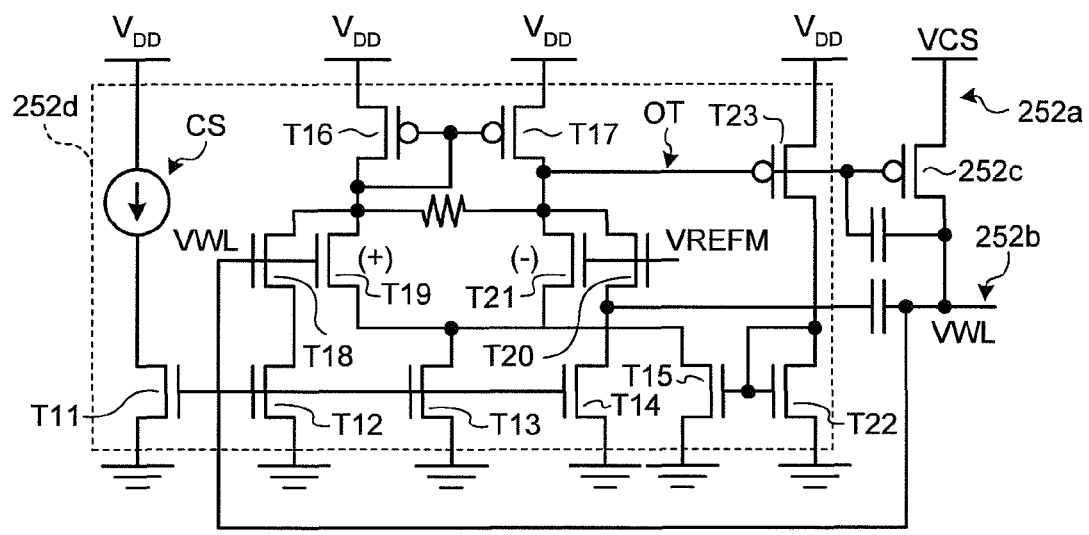

FIGS. 10A and 10B are configuration diagrams of the boost circuit 252. The boost circuit 252 shown in FIG. 10A includes a power supply node (second power supply node) 252a, a signal line 252b, a switch 252c, and a differential amplifier (comparing control unit) 252d. The power supply node 252a receives a voltage VCS higher than the power supply voltage $V_{DD}$ from the outside (e.g. an external power supply unit). The signal line 252b is a line for outputting the voltage VCS to the switching unit 253.

The switch 252c is turned on to connect the power supply node 252a and the signal line 252b. The switch 252c is, for example, a PMOS transistor in which a source is connected to the power supply node 252a, a drain is connected to the signal line 252b, and a gate is connected to the output terminal of the differential amplifier 252d. The switch 252c is turned on/off based on the output signal of the differential amplifier 252d.

The differential amplifier 252d compares a level VWL of the signal line 252b with a level of a reference signal VREFM. Then, when the comparison result indicates equality between the both, the differential amplifier 252d turns on the switch 252c. Whereby, the signal line 252b can output the voltage VCS to the switching unit 253 at a stable level.

The differential amplifier 252d, for example, includes a current source CS, load transistors T11 to T17, input transistors T18 to T21, and transistors T22 and T23 as shown in FIG. 10B. A conductivity type of each of the transistors T16, T17, and T23 is opposite to a conductivity type of each of other transistors. For example, the transistors T16, T17, and T23 are PMOS transistors and other transistors are NMOS transistors.

In the differential amplifier 252d, the transistors T11 to T21 perform a differential amplification between the level VWL of the signal line 252b and the level of the reference signal VREFM and output a differential signal from an output node OT to the transistor T23 and the switch 252c. The transistor T23 feed backs the received signal to the load transistor T15 via the transistor T22. In this manner, because the differential amplifier 252d performs the differential amplification operation while internally performing the feedback, a stable differential amplification operation can be performed.

As described above, in the third embodiment, the drive voltage VWL of the word line is set to the voltage ($V_{DD}+\Delta V$) higher than the power supply voltage $V_{DD}$ in the second mode. It should be noted that, in the first embodiment, although the drive voltage VWL is set to be lower than the power supply voltage $V_{DD}$ (VWL<$V_{DD}$) in the second mode (at a low voltage operation of the memory cell), because $N_{WL}$ is increased to satisfy the mathematical formula (1) and thereby sufficient driving performance for reading out data from the memory cell is ensured, the level of the bit line can afford to be settled in the read period of the data even if the drive voltage VWL of the word line WL is set to be higher than the power supply voltage $V_{DD}$. Similarly, it should be noted that, in the second embodiment, because $N_{cell}$ is limited to satisfy the mathematical formula (1) and thereby the capacitance value of each bit line is sufficiently small (lowered), the level of the bit line can afford to be settled in the read period of the data even if the drive voltage VWL of the word line WL is set to be higher than the power supply voltage $V_{DD}$. Thus, in the third embodiment, in the second mode, the drive voltage VWL of the word line WL is set to a value higher than the power supply voltage $V_{DD}$. In other words, in the second mode, because Disturb does not easily occur at the readout of the data of the memory cell, the drive voltage VWL is set to be higher than the power supply voltage $V_{DD}$ in the range in which Disturb does not occur. Therefore, because the voltage level of the word line can be made high at the writing of data in the memory cell a write failure can be reduced. That is, writing property can be improved while suppressing destruction of data stored in the memory cell when reading out the data from the memory cell.

(Fourth Embodiment)

A semiconductor storage device according to the fourth embodiment is explained with reference to FIG. 11. In the followings, points different from the second embodiment are mainly explained.

In the semiconductor storage device according to the fourth embodiment, a row selector 310 includes an RD determination circuit 312 for performing redundancy repair of the word line connected to a defective memory cell. The RD determination circuit 312 is provided to the row decoders 11 of the plurality of sub-arrays SA in common.

When the control signal MODE indicates the second mode, the row decoder 11 generates a control signal MWLE for enabling the multiple selection. Moreover, the row decoder 11 generates a control signal RDE for enabling the redundancy repair of the word line. Furthermore, the row decoder 11 generates an address signal of the word lines to be multiply-selected selected. For example, when the word lines WL of $N_{WL}=4$ (which can be expressed in 2 bits) are multiply-selected, the row decoder 11 generates an address signal ADD [4:1]. In the followings, exemplary explanation is give for the case of multiply-selecting the $N_{WL}=4$ word lines WL1 to WL4 in word lines indicated by the address signal ADD [4:1] in one sub-array. The number of bits of the address signal is not limited to 4 bits and the number of the word lines to be multiply-selected is not limited to $N_{WL}=4$.

The row decoder 11, for example, includes inverters 131 and 132, OR gates 121 to 124, NAND gates 111 to 114, and inverters 151 to 154. In the row decoder 11, if all of the bits of an RDout [4:1] is at the high level, a 4-bit high-level signal is generated when the control signal MWLE is at the high level (in the case of the second mode). Alternatively, in the row decoder 11, a signal in which 1 bit designated by address signals ADD [1] and ADD [2] is at the high level and the remaining 3 bits are at the low level is generated when the control signal MWLE is at the low level (in the case of the first mode). The RDout [4:1] is input from the RD determination circuit 312 to the NAND gates 111 to 114. The RD determination circuit 312 is connected in parallel with the inverters 131 and 132 and the OR gates 121 to 124 on the input side of the NAND gates 111 to 114.

Moreover, address signals ADD [3] and ADD [4] are input to a logic circuit 161, and the logic circuit 161 generates a high-level signal in a period in which at least one of the word lines WL1 to WL4 is to be selected. For example, when both of the address signals ADD [3] and ADD [4] are at the low level, the logic circuit 161 generates the high-level signal, and when at least one of the address signals ADD [3] and ADD [4] is at the high level, the logic circuit 161 generates a low-level signal.

NAND gates 171 to 174 operate outputs of corresponding inverters 151 to 154 and the output of the logic circuit 161, and inverters 181 to 184 invert the operation results thereof to output them as control signals.

A preset redundant address signal RADD [4:1] corresponding to each sub-array SA is input from the outside (e.g. the external control circuit) to the RD determination circuit 312. The redundant address signal RADD [4:1] is a signal indicating the address of the word line to which the memory cell specified as defective among the memory cells of the sub-array SA is connected by experiment performed in advance. The redundant address signals RADD [4:1] are stored, for example, in a ROM Fuse (e.g. ROM (Read Only Memory) in a fuse circuit (not shown) or a predetermined fuse region in a memory circuit) in a peripheral circuit area of the semiconductor storage device as nonvolatile information.

Moreover, the address signal ADD [4:1] of the word lines to be selected is input to the RD determination circuit 312. The RD determination circuit 312 determines whether there is the address signal matched to the redundant address signal RADD [4:1] in the address signal ADD [4:1] of the word lines. When the control signal RDE is at the active level and there is the address signal matched to the redundant address signal RADD [4:1], the RD determination circuit 312 outputs the signal RDout [4:1] for deselecting the word line corresponding to the matched address signal (redundant address signal) to the row decoder 11. In this case, in the RDout [4:1], for example, a bit corresponding to the word line to be deselected is at the low level and other bits are all at the high level. On the other hand, when the control signal RDE is at the nonactive level or there is no address signal matched to the redundant address signal RADD [4:1], the RD determination circuit 312 outputs the signal RDout [4:1] to the row decoder 11 without change. In this case, the bits of the RDout [4:1] are all at the high level.

In the second mode, the row decoder 11 multiply-selects the word lines in accordance with the signal RDout [4:1] output from the RD determination circuit 312. For example, when the RDout [4:1] in which a bit RDout [1] corresponding to the unselected word line WL1 is at the low level and other bits are at the high level is input, the NAND gates 111 to 114 output a low-level signal to the NAND gate 171 and output a high-level signal to other NAND gates 172 to 174 via the inverters 151 to 154. The low-level signal is output to the word line WL1 by the NAND gate 171 and the inverter 181, so that the word line WL1 becomes an unselected state. On the other hand, the high-level signal is output to the word lines WL2 to WL4 and the word lines WL2 to WL4 are multiply-selected. In this manner, when there is the address signal matched to the redundant address signal RADD [4:1] among the address signals of the word lines to be selected, the row selector 310 deselects the word line corresponding to the matched address signal among $N_{WL}$ word lines to be selected.

Figure 12:
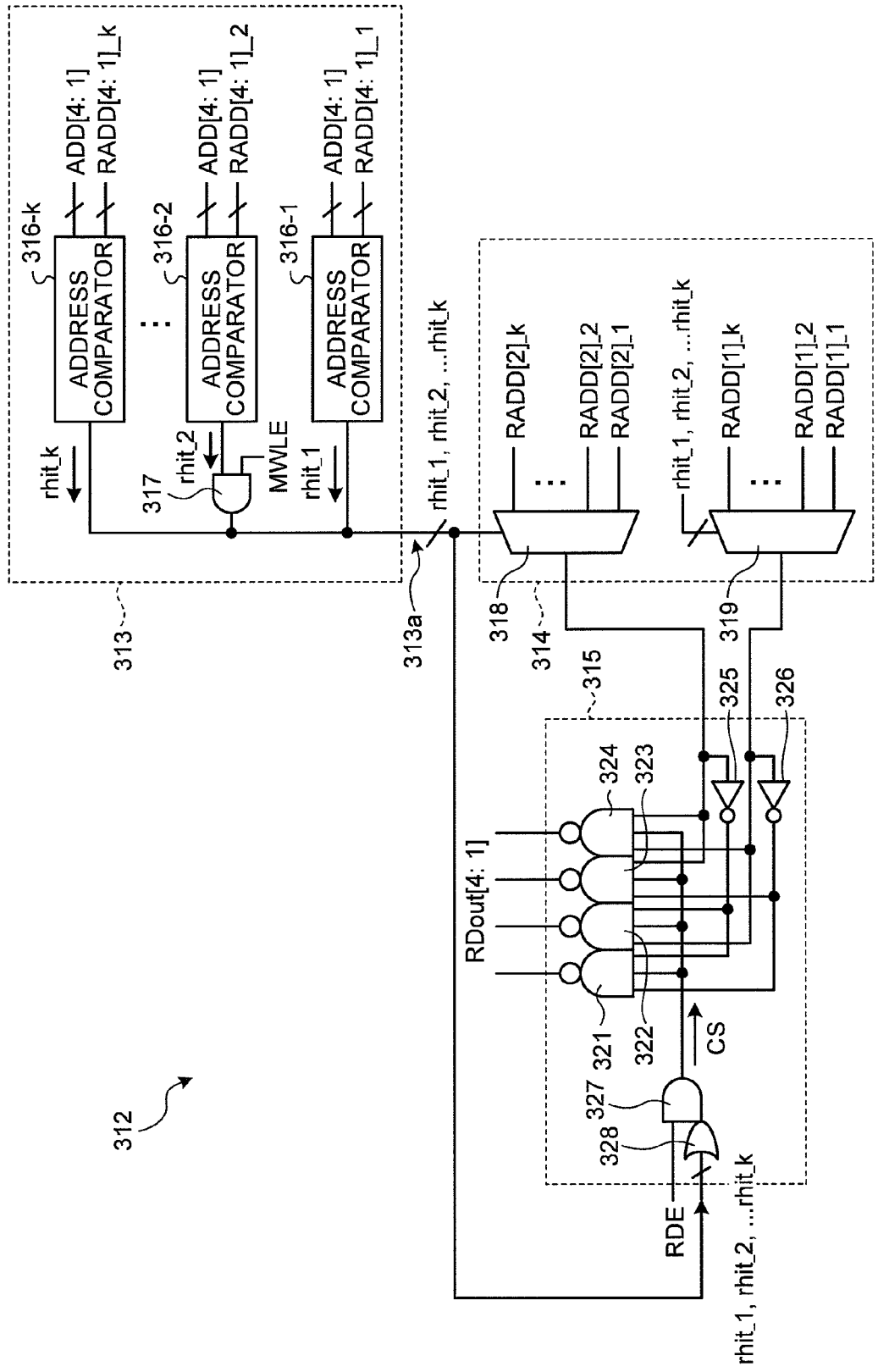
FIG. 12 is a diagram illustrating a configuration of an RD determination circuit in the fourth embodiment.

FIG. 12 is a configuration diagram of the RD determination circuit 312 in the fourth embodiment. The RD determination circuit 312 is provided in common to the row decoders 11 and has a configuration corresponding to the sub-arrays SA. The RD determination circuit 312 includes an address comparing unit 313, an address selector 314, and a decode unit 315.

The address comparing unit 313 compares the address signal ADD [4:1] of the word lines to be selected with a plurality of the redundant address signals RADD [4:1], and outputs the comparison results. The address comparing unit 313, for example, includes a plurality of address comparators 316 corresponding to the plurality of sub-arrays SA. Each address comparator 316 compares the address signal ADD [4:1] of the word lines to be selected with the corresponding redundant address signal RADD [4:1] for each sub-array SA and outputs a comparison result rhit.

When the comparison result needs to be output in the second mode and does not need to be output in the first mode for a specific sub-array, for example, it is applicable to connect an AND gate 317 between an output node 313a and the output terminal of the address comparator 316 of the address comparing unit 313 such that the AND gate 317 performs an AND operation between the comparison results rhit output from the address comparator 316 and the control signal MWLE.

When there is the address signal matched to the redundant address signal RADD [4:1] in the address signal ADD [4:1] of the word lines to be selected, the address comparing unit 313 outputs the high level, and when there is no matched address signal, the address comparing unit 313 outputs the low level.

The address selector 314 outputs, based on the comparison results rhit, the corresponding redundant address signal from the redundant address signals RADD [4:1] to the decode unit 315. For example, the address selector 314 includes selectors 318 and 319 the number of which corresponds to the number of bits that can express $N_{WL}$ word lines.

For example, when there is the address signal matched to a redundant address signal RADD [4:1]_1 for a sub-array SA1, the selectors 318 and 319 output redundant address signals RADD [1]_1 and RADD [2]_1 corresponding to the matched address signal to the decode unit 315.

When the control signal RDE is at the active level and there is the matched address signal, the decode unit 315 decodes the redundant address signal from the address selector 314. On the other hand, when the control signal RDE is at the nonactive level or there is no matched address signal, the decode unit 315 outputs the redundant address signal from the address selector 314 without decoding.

The decode unit 315, for example, includes inverters 325 and 326, and NAND gates 321 to 324, and generates a signal in which 1 bit designated by the redundant address signal from the address selector 314 is at the low level and the remaining 3 bits are at the high level when a control signal CS is at the high level.

The control signal CS is generated by an OR gate 328 and an AND gate 327. When the control signal RDE is at the active level and there is the matched address signal, the OR gate 328 and the AND gate 327, for example, output the control signal CS at the high level to each of the NAND gates 321 to 324. Whereby, the NAND gates 321 to 324 output the signal RDout [4:1] in which 1 bit designated by the redundant address signal is at the low level and the remaining 3 bits are at the high level to the corresponding row decoder 11.

Alternatively, when the control signal RDE is at the non-active level or there is no matched address signal, the OR gate 328 and the AND gate 327, for example, output the control signal CS at the low level to each of the NAND gates 321 to 324. Whereby, the NAND gates 321 to 324 output the signal RDout [4:1] in which all of the bits are at the high level to the corresponding row decoder 11.

Figure 13A:
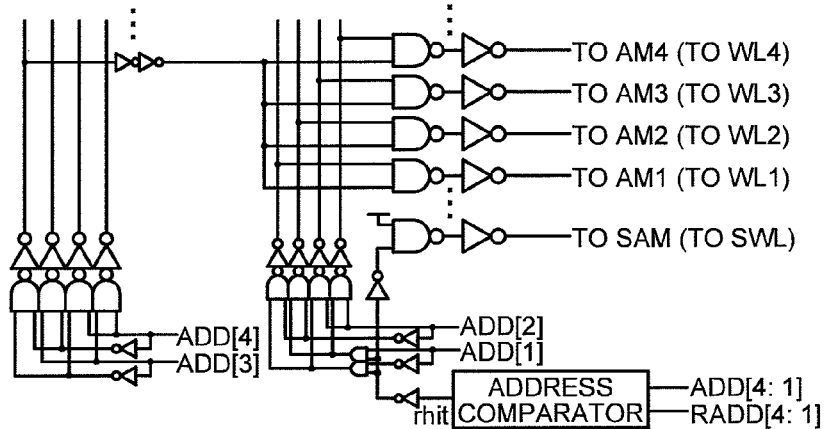
FIGS. 13A to 13C are diagrams, each illustrating a configuration of a row selector in a comparison example.
Figure 13B:
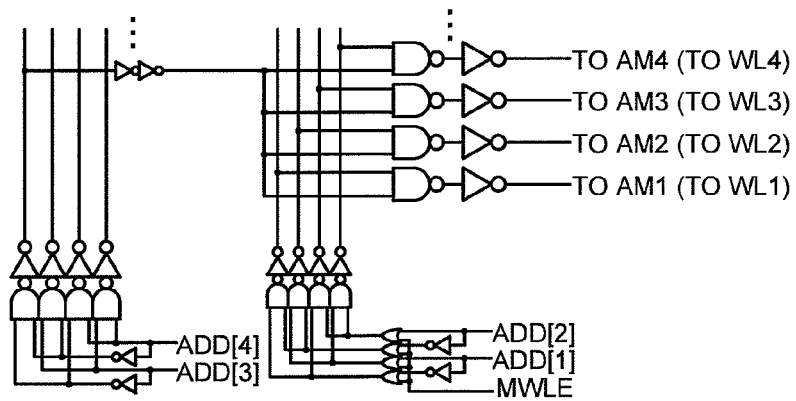
Figure 13C:
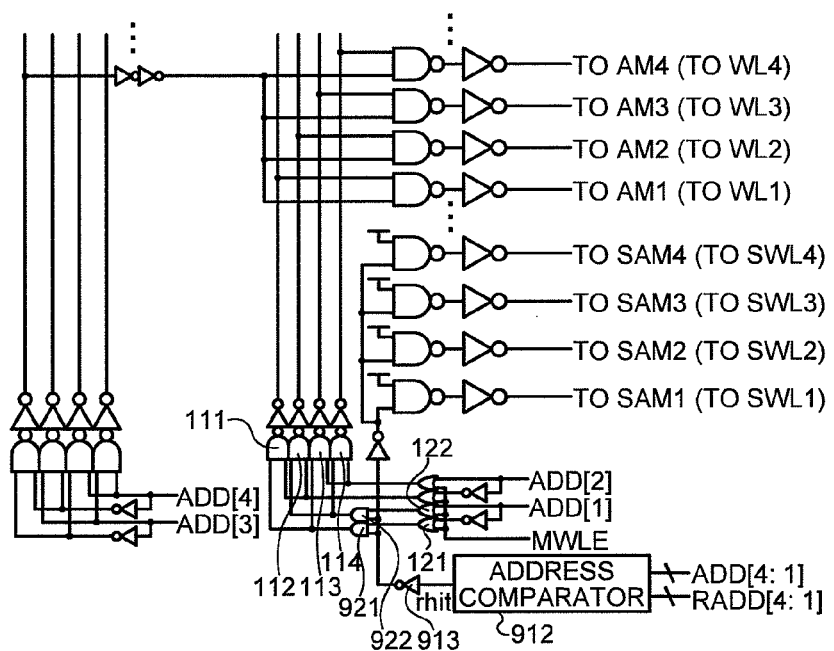

A case is assumed where a circuit shown in FIG. 13C is employed as the configuration in the row selector 310. The circuit shown in FIG. 13C is a circuit that is obtained when a circuit shown in FIG. 13A and a circuit shown in FIG. 13B are simply combined for performing the redundancy repair of the word line while multiply-selecting the word lines. The circuit shown in FIG. 13A is a circuit that does not have a function of multiply-selecting the word lines and is a replacement-type circuit that performs the redundancy repair by replacing the word line connected to a defective memory cell by a redundant word line. The circuit shown in FIG. 13B is a circuit that does not have a function of performing the redundancy repair of the word line and is a circuit for performing the multiple selection. The circuit shown in FIG. 13C has a configuration equivalent to one in which two AND gates 921 and 922 are connected in series between the NAND gates 111 to 114 and the OR gates 121 and 122, the two AND gates 921 and 922 performing the AND operation with a signal obtained by logically inverting the comparison result rhit. With this configuration, when there is the word line (e.g. WL1) connected to the memory cell that does not become defective in the first mode but becomes defective in the second mode among the word lines WL to be selected, all of the word lines WL (i.e. WL1-WL4) are replaced by redundant word lines SWL (i.e. SWL1-SWL4) in the second mode. Therefore, in the second mode, not only the word line connected to the defective memory cell but also other word lines that are not connected to the defective memory cell are replaced, so that the number of necessary redundant word lines (and the number of necessary redundant memory cells) tends to increase, thus an area efficiency in the redundancy repair may be lowered.

Figure 11:
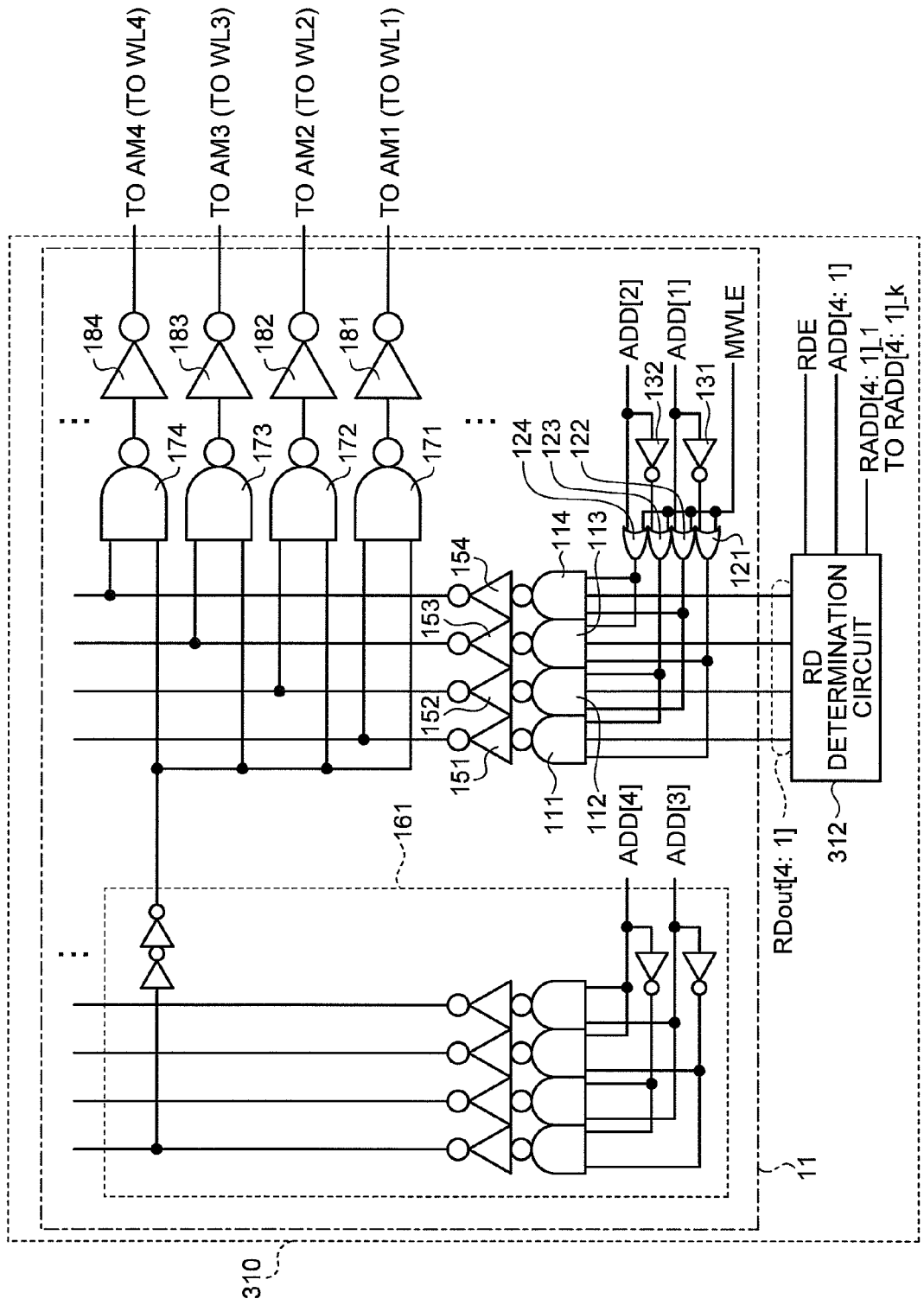
FIG. 11 is a diagram illustrating a configuration of a row selector in a fourth embodiment.

As shown in FIG. 11, in the fourth embodiment, the signal RDout [4:1] in accordance with the comparison result rhit is directly input to the NAND gates 111 to 114 instead of inputting to the AND gates 921 and 922 between the NAND gates 111 to 114 and the OR gates 121 and 122. In other words, on the input side of the NAND gates 111 to 114, an arrangement where the configuration for reflecting the comparison result rhit (i.e. the RD determination circuit 312) is connected in parallel with respect to the line connecting the NAND gates 111 to 114 and the OR gates 121 and 122 is adapted in stead of an arrangement where the configuration for reflecting the comparison result rhit (i.e. address comparator 912, inverter 913, and the AND gates 921 and 922) is inserted in series in the line connecting the NAND gates 111 to 114 and the OR gates 121 and 122. In such a circuit shown in FIG. 11, in the second mode, the RD determination circuit 312 determines whether there is the address signal matched to the redundant address signal among the address signals of the word lines to be selected. When there is the matched address signal, the RD determination circuit 312 outputs the signal RDout [4:1] for deselecting the word line corresponding to the matched address signal to the corresponding row decoder 11. The row decoder 11 deselects the corresponding word line and selects remaining word lines in accordance with the signal RDout [4:1]. Whereby, when there is the word line connected to the memory cell that becomes defective in the second mode among the word lines WL to be selected, it is possible to perform the redundancy repair of the word line connected to the defective memory cell without providing the redundant word line while operating each memory cell in the second mode. Moreover, the area efficiency in the redundancy repair can be improved.

(Fifth Embodiment)

Figure 14:
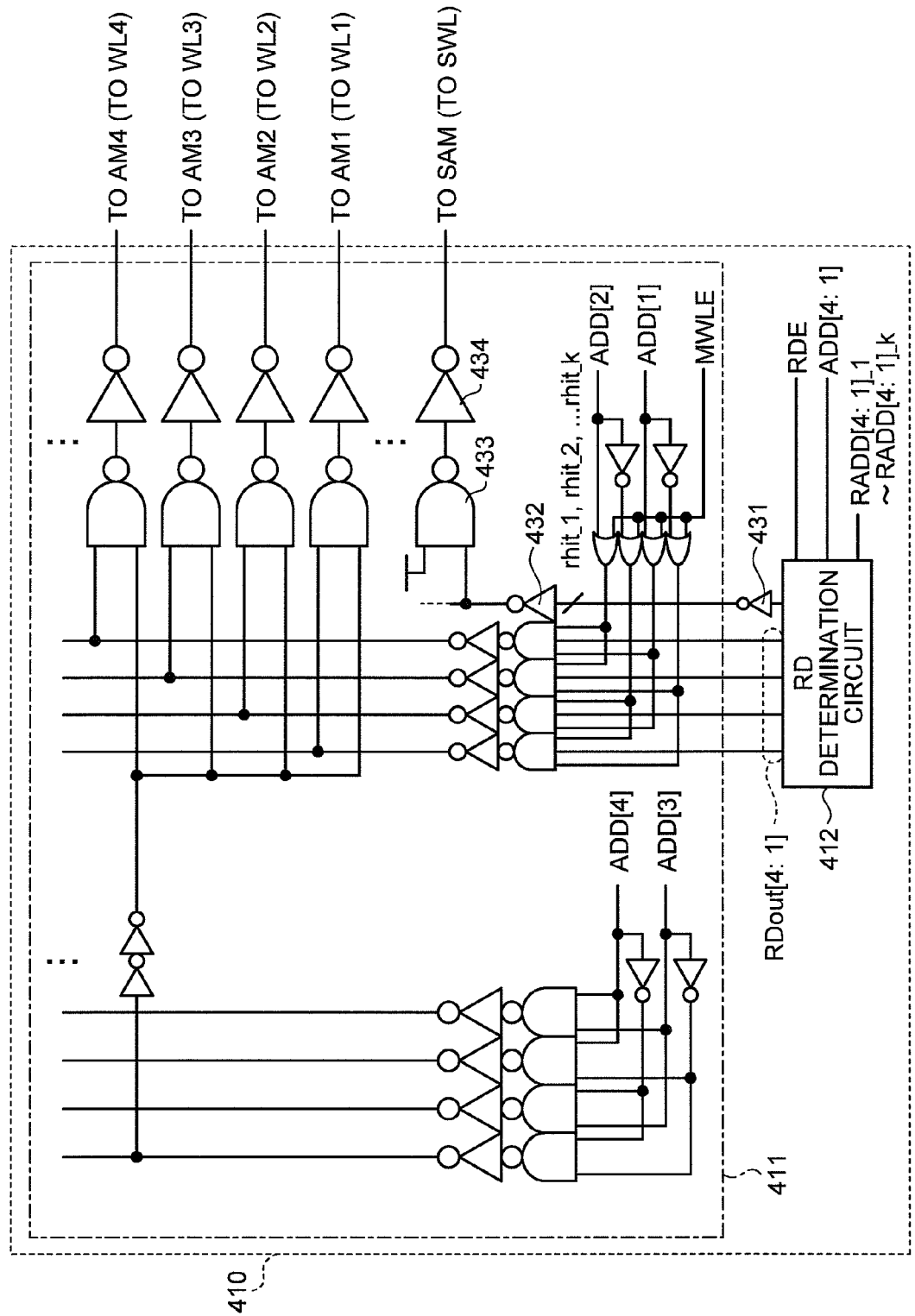
FIG. 14 is a diagram illustrating a configuration of a row selector in a fifth embodiment.

A semiconductor storage device according to the fifth embodiment is explained with reference to FIG. 14. In the followings, points different from the fourth embodiment are mainly explained.

The semiconductor storage device according to the fifth embodiment includes the global memory cell array GMA including a plurality of the memory cell arrays MA, a redundant memory cell array (not shown), a redundant word line SWL, and a row selector 410. In the redundant memory cell array, for example, a plurality of redundant memory cells is arranged on the redundant word line SWL corresponding to at least one row of rows in the sub-array SA.

When there is the address signal matched to the redundant address signal RADD [4:1] among the address signals of the word lines to be selected, the row selector 410 deselects the word line corresponding to the matched address signal among $N_{WL}$ word lines and selects the redundant word line SWL instead of the word line that is deselected.

The row selector 410 includes row decoders 411 of the sub-arrays SA and an RD determination circuit 412 that is shared with the sub-arrays SA. The RD determination circuit 412 has the internal configuration similar to the RD determination circuit 312 and moreover outputs the comparison results rhit to the row decoders 411.

Each row decoder 411 further includes, for example, inverters 431, 432, and 434 and a NAND gate 433. The comparison result rhit is input to the NAND gate 433 via the inverters 431 and 432. When the input signal rhit is at the high level, the NAND gate 433 and the inverter 434 select the redundant word line SWL. In other words, when there is the address signal matched to the redundant address signal RADD [4:1], the redundant word line SWL is selected. On the other hand, when the signal rhit is at the low level, the NAND gate 433 and the inverter 434 do not select the redundant word line SWL.

Whereby, when there is the memory cell that becomes defective in both of the first and second modes among the word lines WL to be selected, the word line connected to the defective memory cell can be subjected to the redundancy repair even when each memory cell is operated in the first mode. Alternatively, when there is the memory cell that is defective in the first mode and does not become defective in the second mode among the word lines WL, the word line connected to the defective memory cell can be subjected to the redundancy repair while operating each memory cell in the first mode. In this manner, when the defective memory cells are different depending on the mode, for each mode, the defective memory cells can be selected and can be repaired.

Moreover, it is sufficient that the redundant word line SWL is provided for the number (at least one) corresponding to at least one row of the rows in the sub-array SA. Furthermore, the redundant memory cells are the memory cells corresponding to at least one row of the rows of the sub-array SA. Whereby, the number of the necessary redundant word lines (and the number of the necessary redundant memory cells)

can be reduced compared with the configuration shown in FIG. 13C, and thus the area efficiency in the redundancy repair can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a memory cell array comprising a plurality of memory cells in a matrix arrangement, wherein the plurality of memory cells operate at an operating frequency ($T_{cyc}$);
a plurality of word lines which extend in a row direction of the matrix and which are connected to at least one of the plurality of memory cells;
a plurality of bit lines which extend in a column direction of the matrix and which are connected to at least one of the plurality of memory cells, wherein each bit line of the plurality of bit lines conducts a read-out current ($I_{cell}$) and has a bit-line capacitance (C); and
a row selector configured to multiply-select a number of word lines ($N_{WL}$), such that the number of memory cells connected to each of the bit lines ($N_{cell}$), divided by the number of word lines multiply-selected by the row selector ($N_{WL}$), is less than or equal to four (4) times a power supply voltage ($V_{DD}$), times the bit-line capacitance (C), divided by the product of the operating frequency ($T_{cyc}$) of the plurality of memory cells, the read-out current ($I_{cell}$) of each bit line of the plurality of bit lines, and the number of memory cells connected to each of the bit lines ($N_{cell}$),
wherein the row selector is further configured to:
receive a preset redundant address signal;
determine whether the redundant address signal matches an address signal among a plurality of address signals of multiply-selected word lines; and
deselect a word line corresponding to the matched address signal when the redundant address signal matches an address signal.

2. The semiconductor storage device of claim 1, further comprising:
a redundant memory cell array comprising a plurality of redundant memory cells; and
a redundant word line connected to at least one of the plurality of redundant memory cells, wherein
the row selector is configured to select the redundant word line instead of deselected word line when the redundant address signal matches an address signal.

3. A semiconductor storage device including a plurality of sub-arrays, wherein
each of the sub-arrays comprises
a memory cell array comprising a plurality of memory cells in a matrix arrangement, wherein the plurality of memory cells operate at an operating frequency $T_{cyc}$;
a plurality of word lines which extend in a row direction of the matrix and which are connected to at least one of the plurality of memory cells;
a plurality of bit lines which extend in a column direction of the matrix and which are connected to at least one of the plurality of memory cells, wherein each bit line of the plurality of bit lines conducts a read-out current $I_{cell}$ and has a bit-line capacitance; and
a row selector configured to multiply-select a number of word lines ($N_{WL}$), such that the number of memory cells connected to each of the bit lines ($N_{cell}$), divided by the number of word lines multiply-selected by the row selector ($N_{WL}$), is less than or equal to four (4) times a power supply voltage ($V_{DD}$), times the bit-line capacitance (C), divided by the product of the operating frequency ($T_{cyc}$) of the plurality memory cells, the read-out current ($I_{cell}$) of each bit line of the plurality of bit lines, and the number of memory cells connected to each of the bit lines ($N_{cell}$),
wherein the row selector of each sub-array is further configured to:
receive a preset redundant address signal;
determine whether the redundant address signal matches an address signal among a plurality of address signals of multiply-selected word lines; and
deselect a word line corresponding to the matched address signal when the redundant address signal matches an address signal.

4. The semiconductor storage device of claim 3, wherein each sub-array further comprises:
a redundant memory cell array comprising a plurality of redundant memory cells; and
a redundant word line connected to at least one of the plurality of redundant memory cells, wherein
the row selector is configured to select the redundant word line instead of deselected word line when the redundant address signal matches an address signal.

* * * * *